(12) United States Patent
Arimoto

(10) Patent No.: US 10,298,192 B2
(45) Date of Patent: May 21, 2019

(54) SOUND PROCESSING DEVICE AND SOUND PROCESSING METHOD

(71) Applicant: Yamaha Corporation, Hamamatsu-shi, Shizuoka-Ken (JP)

(72) Inventor: Keita Arimoto, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 15/938,448

(22) Filed: Mar. 28, 2018

(65) Prior Publication Data

US 2018/0219521 A1  Aug. 2, 2018

Related U.S. Application Data

(63) Continuation of application No. PCT/JP2016/078753, filed on Sep. 29, 2016.

(30) Foreign Application Priority Data

Sep. 29, 2015  (JP) ................. 2015-191027

(51) Int. Cl.
*H03G 3/32* (2006.01)
*G10H 1/00* (2006.01)
*G10H 1/057* (2006.01)
*H04H 60/04* (2008.01)
*G10H 1/08* (2006.01)
*G10H 1/46* (2006.01)
*H03G 3/04* (2006.01)

(52) U.S. Cl.
CPC .............. *H03G 3/32* (2013.01); *G10H 1/00* (2013.01); *G10H 1/057* (2013.01); *G10H 1/08* (2013.01); *G10H 1/46* (2013.01); *H03G 3/04* (2013.01); *H04H 60/04* (2013.01); *G10H 2240/325* (2013.01)

(58) Field of Classification Search
CPC ............ G10H 1/00–7/12; G10K 15/04; G10L 25/51–25/66
USPC ....................... 381/107, 56, 104, 57; 704/270
See application file for complete search history.

(56) References Cited

U.S. PATENT DOCUMENTS

2011/0033061 A1  2/2011  Sakurada et al.

FOREIGN PATENT DOCUMENTS

| JP | 2008-309928 A |   | 12/2008 |
|----|---------------|---|---------|
| JP | 2008309928 A  | * | 12/2008 |
| JP | 2010-34983 A  |   | 2/2010  |
| JP | 2013-15601 A  |   | 1/2013  |

(Continued)

OTHER PUBLICATIONS

International Search Report (PCT/ISA/210) issued in PCT Application No. PCT/JP2016/078753 dated Dec. 13, 2016 with English-language translation (five (5) pages).

(Continued)

*Primary Examiner* — Melur Ramakrishnaiah
(74) *Attorney, Agent, or Firm* — Crowell & Moring LLP

(57) ABSTRACT

A recorded signal representing a recorded sound generated by a sound generation source is reproduced. A type of a sound generation source of a performance sound represented by a performance signal is specified. A sound volume of the recorded signal is reduced in a case where the sound generation source of the recorded signal corresponds to the specified type of the sound generation source.

11 Claims, 5 Drawing Sheets

(56) References Cited

FOREIGN PATENT DOCUMENTS

JP    2015-12592 A    1/2015

OTHER PUBLICATIONS

Japanese-language Written Opinion (PCT/ISA/237) issued in PCT Application No. PCT/JP2016/078753 dated Dec. 13, 2016 (four (4) pages).

International Search Report (PCT/ISA/210) issued in PCT Application No. PCT/JP2016/078752 dated Dec. 20, 2016 with English-language translation (five (5) pages).

Japanese-language Written Opinion (PCT/ISA/237) issued in PCT Application No. PCT/JP2016/078752 dated Dec. 20, 2016 (four (4) pages).

International Search Report (PCT/ISA/210) issued in PCT Application No. PCT/JP2016/078754 dated Dec. 13, 2016 with English-language translation (three (3) pages).

Japanese-language Written Opinion (PCT/ISA/237) issued in PCT Application No. PCT/JP2016/078754 dated Dec. 13, 2016 (three (3) pages).

International Preliminary Report on Patentability (PCT/IB/338 & PCT/IB/373) issued in PCT Application No. PCT/JP2016/078753 dated Apr. 12, 2018, including English translation of document C2 (Japanese-language Written Opinion (PCT/ISA/237) previously filed on Mar. 28, 2018) (eight (8) pages).

International Preliminary Report on Patentability (PCT/IB/338 & PCT/IB/373) issued in PCT Application No. PCT/JP2016/078752 dated Apr. 12, 2018, including English translation of document C4 (Japanese-language Written Opinion (PCT/ISA/237) previously filed on Mar. 28, 2018) (seven (7) pages).

International Preliminary Report on Patentability (PCT/IB/338 & PCT/IB/373) issued in PCT Application No. PCT/JP2016/078754 dated Apr. 12, 2018, including English translation of document C6 (Japanese-language Written Opinion (PCT/ISA/237) previously filed on Mar. 28, 2018) (six (6) pages).

\* cited by examiner

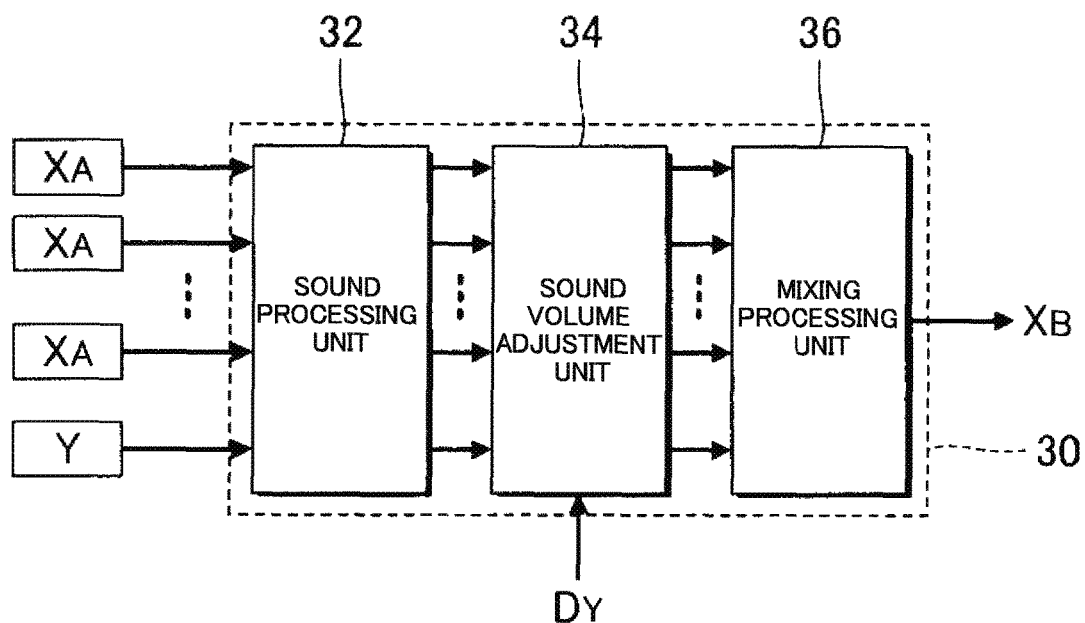

SOUND PROCESSING DEVICE AND SOUND PROCESSING METHOD

CROSS-REFERENCE TO RELATED APPLICATION

The present disclosure contains subject matter related to that disclosed in Japanese Patent Application JP2015-191027 filed in the Japan Patent Office on Sep. 29, 2015 and International Patent Application PCT/JP2016/078753 filed in the Japan Patent Office on Sep. 29, 2016, the entire contents of which are hereby incorporated by reference.

BACKGROUND OF THE INVENTION

1. Field of the invention

The present invention relates to a technique for controlling reproduction of a sound signal.

2. Description of the Related Art

Conventionally, a technique for specifying the type of a sound generation source based on various sounds such as singing voice or performance sound of a musical instrument has been proposed. For example, JP2013-15601A discloses a technique in which feature data generated by analysis of a recorded sound is successively collated with registered feature data registered for each type of sound generation source in a sound source database, thus specifying the type of the sound generation source of the recorded sound.

SUMMARY OF THE INVENTION

Incidentally, a situation where a user plays a musical instrument (has a session) in parallel with reproduction of a recorded sound may be considered. However, there are cases where the coexistence of a performance sound and a recorded sound may give a musically unnatural impression, such as where a performance sound of the musical instrument played by the user and a recorded sound have the same content of sound (for example, melody). Also, the recorded sound may obstruct the performance of the musical instrument by the user. In view of the foregoing circumstances, an object of the invention is to facilitate a performance in parallel with reproduction of a recorded signal.

A sound processing device according to one embodiment of the invention includes: at least one controller; and at least one memory that stores a plurality of instructions, which when executed by the at least one controller, cause the at least one controller to: reproduce a recorded signal representing a recorded sound generated by a sound generation source; specify a type of a sound generation source of a performance sound represented by a performance signal; and reduce a sound volume of the recorded signal in a case where the sound generation source of the recorded signal corresponds to the specified type of the sound generation source.

A sound processing method according to one embodiment of the invention is a sound processing method which is executed by at least one controller and includes: reproducing a recorded signal representing a recorded sound generated by a sound generation source; specifying a type of a sound generation source of a performance sound represented by a performance signal; and reducing a sound volume of the recorded signal in a case where the sound generation source of the recorded signal corresponds to the specified type of the sound generation source.

A sound processing device according to one embodiment of the invention includes: a reproduction control unit that reproduces a recorded signal representing a recorded sound generated by a sound generation source; and a sound source identification unit that specifies a type of a sound generation source of a performance sound represented by a performance signal. The reproduction control unit reduces a sound volume of the recorded signal in a case where the sound generation source of the recorded signal corresponds to the type of the sound generation source specified by the sound source identification unit.

BRIEF DESCRIPTION OF THE DRAWINGS

FIG. 7 is a view of the configuration of a reproduction control unit.

FIG. 8 is a schematic view of relation information.

DETAILED DESCRIPTION OF THE INVENTION

<First Embodiment>

Figure 1:
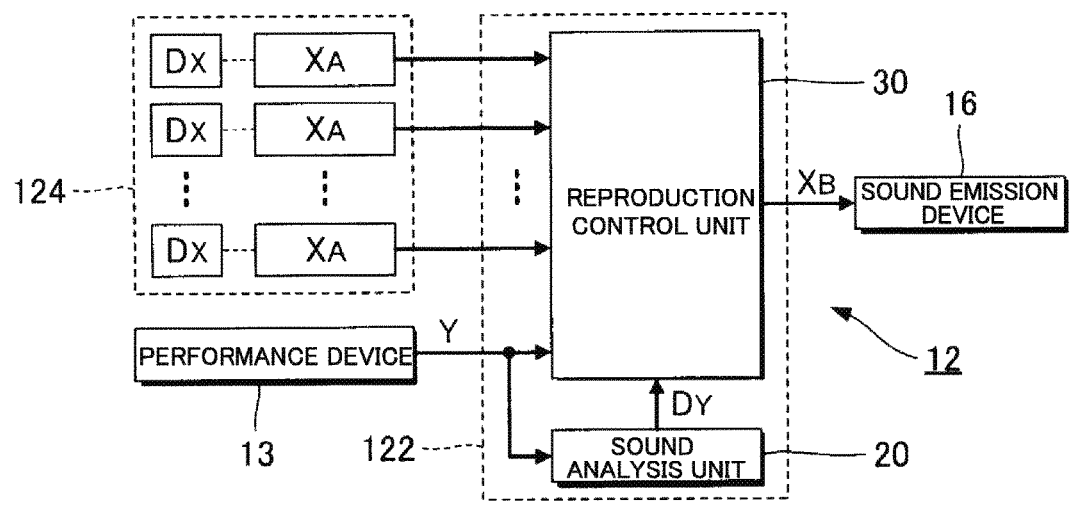
FIG. 1 is a view of the configuration of a sound processing device according to a first embodiment of the invention.

FIG. 1 is a view of the configuration of a sound processing device 12 according to a first embodiment of the invention. As illustrated in FIG. 1, a performance device 13 and a sound emission device 16 are connected to the sound processing device 12. In FIG. 1, the performance device 13 and the sound emission device 16 are shown as separate elements from the sound processing device 12. However, it is also possible to equip the sound processing device 12 with the performance device 13 and the sound emission device 16.

The performance device 13 generates a sound signal (hereinafter referred to as "performance signal") Y representing a sound (hereinafter referred to as "performance sound") according to a performance action by a user. Specifically, an electronic musical instrument which generates the performance signal Y of a musical sound performed by the user, or a sound receiving device which generates the performance signal Y of a singing voice generated by the user's singing, can be used as the performance device 13. An A/D converter which converts the performance signal Y generated by the performance device 13 from analog to digital is not illustrated for the sake of convenience.

The performance sound represented by the performance signal Y is a harmonic sound or an inharmonic sound. A harmonic sound is a sound with a harmonic property such that a harmonic structure in which a fundamental tone component of a fundamental frequency and a plurality of harmonic components are arranged on a frequency axis is clearly observed. For example, a musical sound of a harmonic instrument such as a string instrument or a wind instrument, or a human vocal sound such as singing voice, is a typical example of harmonic sound. Meanwhile, an inharmonic sound is a sound with an inharmonic property such that a harmonic structure is not observed clearly. For example, a musical sound of a percussion instrument such as a drum or a cymbal is a typical example of inharmonic sound.

Also, a harmonic sound means a sound which includes a harmonic sound component dominantly over an inharmonic sound component. Therefore, the concept of a harmonic sound includes a sound which includes both a harmonic sound component and an inharmonic sound component but whose overall harmonic property is dominant, as well as a sound made up of a harmonic sound component only. Similarly, an inharmonic sound means a sound which includes an inharmonic sound component dominantly over a harmonic sound component. Therefore, the concept of an inharmonic sound includes a sound which includes both a harmonic sound component and an inharmonic sound component but whose overall inharmonic property is dominant, as well as a sound made up of an inharmonic sound component only. In the description below, a suffix H (harmonic) maybe added to the symbols of elements related to harmonic sound, and a suffix P (percussive) maybe added to the symbols of elements related to inharmonic sound.

The sound processing device 12 is realized by a computer system having a controller (control device) 122 and a storage device 124. The storage device 124 is a known recording medium such as a magnetic recording medium or a semiconductor recording medium, or a combination of a plurality of recording media. The storage device 124 stores a program executed by the controller 122 and various data used by the controller 122.

The storage device 124 in the first embodiment stores a plurality of sound signals (hereinafter referred to as "recorded signals") XA representing sounds (hereinafter referred to as "recorded sounds") generated by different sound sources. The respective recorded sounds of the plurality of recorded signals XA are sounds recorded by recording devices arranged near the different sounds sources (for example, a musical instrument which is played and thus generates a musical sound, and a vocalist who generates a singing voice). Specifically, sounds of musical instruments for respective playing parts of an arbitrary piece of music are recorded by a plurality of recording devices within a sound space such as a recording studio. Thus, a plurality of recorded signals XA is generated. To each of the plurality of recorded signals XA, sound source identification information DX indicating the type of the sound generation source of the recorded sound represented by the recorded signal XA is added. The sound source identification information DX is, for example, the name of the sound generation source (specifically, musical instrument name or playing part name). Also, the recorded signal XA and the sound source identification information DX can be stored in a storage device (for example, cloud storage) outside the sound processing device 12. That is, the function of storing the recorded signal XA and the sound source identification information DX can be omitted from the sound processing device 12.

The controller 122 executes a program stored in the storage device 124 and thus realizes a sound analysis unit 20 and a reproduction control unit 30. Also, a configuration in which a part or the entirety of the functions of the controller 122 is realized by a dedicated electronic circuit, or a configuration in which the functions of the controller 122 are dispersed to a plurality of devices can be employed.

The sound analysis unit 20 specifies the type of the sound generation source of the performance sound represented by the performance signal Y supplied from the performance device 13. Specifically, the sound analysis unit 20 generates sound source identification information DY indicating the type of the sound generation source of the performance sound. Similarly to the sound source identification information DX, the sound source identification information DY is, for example, the name of the sound generation source. Meanwhile, the reproduction control unit 30 reproduces the plurality of recorded signals XA stored in the storage device 124, from the sound emission device 16. The user performs a desired playing part of the piece of music (that is, has a session) in parallel with the reproduction of the plurality of recorded signals XA with the performance device 13. The reproduction control unit 30 in the first embodiment generates a sound signal XB from the plurality of recorded signals XA and the performance signal Y. The sound emission device 16 (for example, a speaker or a headphones) emits a sound corresponding to the sound signal XB generated by the sound processing device 12 (reproduction control unit 30). A D/A converter which converts the sound signal XB generated by the sound processing device 12 from digital to analog is not illustrated for the sake of convenience. A specific example of the sound analysis unit 20 and the reproduction control unit 30 will be described in detail below.

<Sound Analysis Unit 20>

Figure 2:
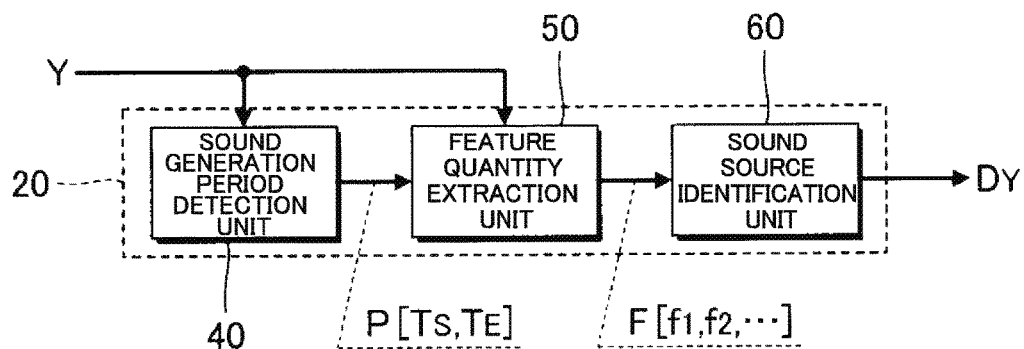
FIG. 2 is a view of the configuration of a sound analysis unit.

FIG. 2 is a view of the configuration of the sound analysis unit 20. As illustrated in FIG. 2, the sound analysis unit 20 in the first embodiment includes a sound generation period detection unit 40, a feature quantity extraction unit 50, and a sound source identification unit 60.

Figure 3:
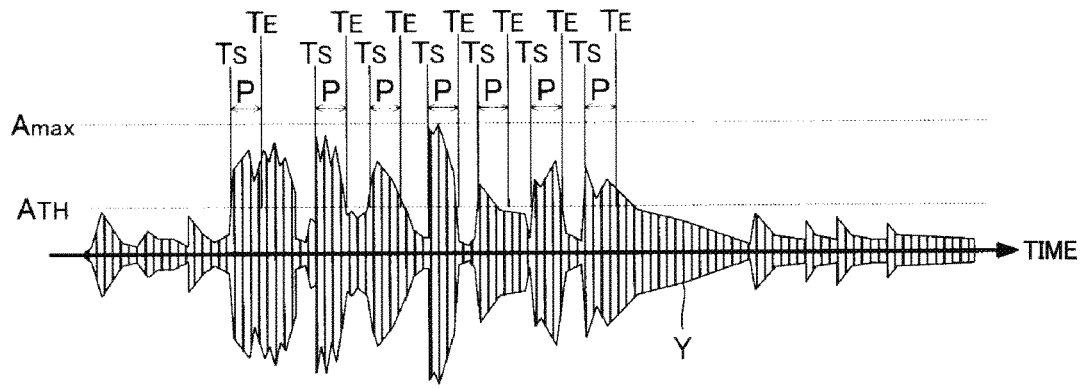
FIG. 3 is an explanatory view of each sound generation period of a sound signal.

The sound generation period detection unit 40 of FIG. 2 detects a plurality of sound generation periods P of the performance signal Y. FIG. 3 shows the relation between the waveform of the performance signal Y and the sound generation periods P. As understood from FIG. 3, each sound generation period P is a segment on a time axis during which the performance sound represented by the performance signal Y is generated, and a segment from a point when the generation of the performance sound starts (hereinafter referred to as "sound generation start point") TS to an endpoint (hereinafter referred to as "sound generation end point") TE.

Specifically, the sound generation period detection unit 40 in the first embodiment specifies a point when the intensity of the performance signal Y exceeds a threshold ATH, as the sound generation start point TS, and specifies a point after the lapse of a predetermined time from the sound generation start point TS, as the sound generation end point TE. An arbitrary method for selecting the threshold ATH may be employed. However, a numerical value that is obtained by multiplying a maximum value Amax of the intensity of the performance signal Y by a positive number smaller than 1 (for example, 0.5) is preferable as the threshold ATH. Also, a point when the intensity of the performance signal Y is reduced to a predetermined threshold (for example, a numerical value according to the maximum value Amax) after the lapse of the sound generation start point TS can be specified as the sound generation end point TE.

The feature quantity extraction unit 50 of FIG. 2 extracts a feature quantity F of the performance signal Y. The feature quantity extraction unit 50 in the first embodiment successively extracts the feature quantity F for each sound generation period P detected by the sound generation period detection unit 40. The feature quantity F is an indicator indicating a sound characteristic of the performance signal Y in the sound generation period P. The feature quantity F in the first embodiment is expressed by a vector including a plurality of different types of characteristic values f (f1, f2, . . . ). Specifically, the feature quantity F includes a plurality of types of characteristic values f such as MFCC (mel-frequency cepstral coefficients) representing the tone of the performance signal Y, the degree of steepness of a sound rise in the sound generation period P, the intensity ratio of a harmonic component to a fundamental tone component, and the number of zero crossings, which is the number of times or the frequency at which the sign of the intensity of the performance signal Y is reversed.

Characteristics of a sound generated by each sound generation source are particularly prominent immediately after the sound generation start point TS. In the first embodiment, the feature quantity F of the performance signal Y is extracted every sound generation start point TS (every sound generation period P) of the performance signal Y. This is advantageous in that the feature quantity F in which unique characteristics of each type of sound generation source is prominently reflected can be extracted, compared with a configuration in which the feature quantity F is extracted for each period formed by dividing the performance signal Y, irrespective of the presence/absence and time point of sound generation. However, it is also possible to extract the feature quantity F for each period formed by dividing the performance signal Y on the time axis, irrespective of the presence/absence and time point of sound generation by the sound generation source (and therefore the sound generation segment detection unit 40 can be omitted).

Figure 4:
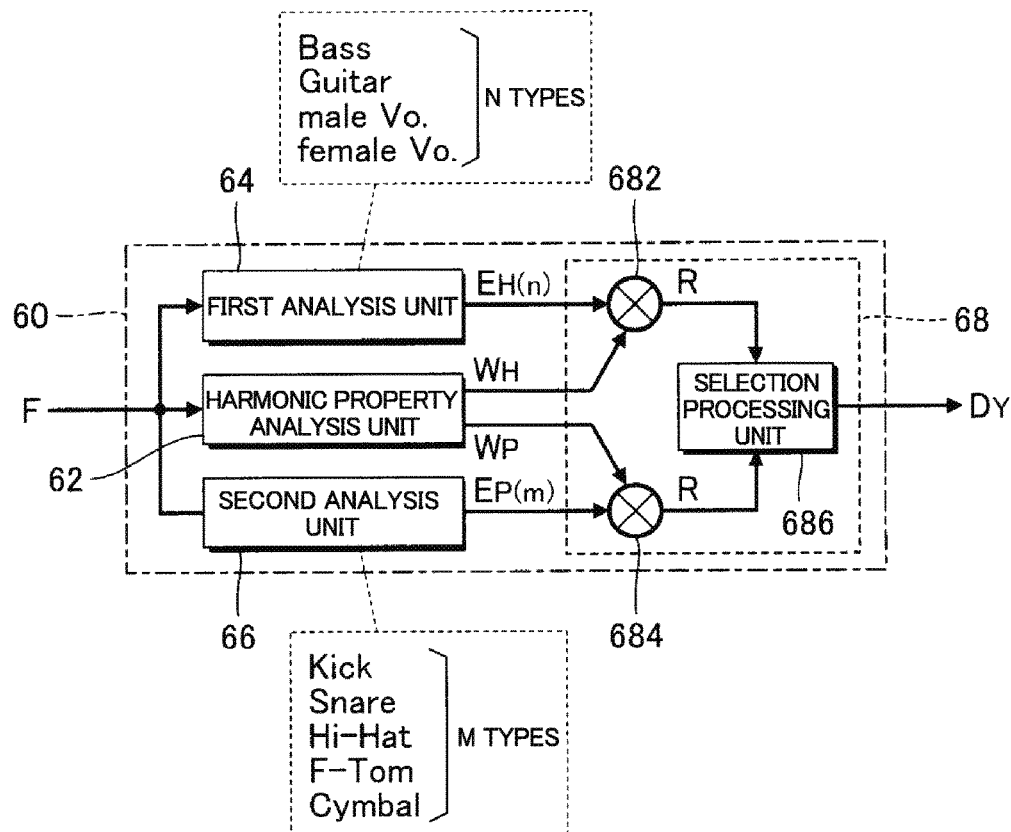
FIG. 4 is a view of the configuration of a sound source identification unit.

The sound source identification unit 60 identifies the type of the sound generation source of the performance signal Y, using the feature quantity F extracted by the feature quantity extraction unit 50, and thus generates the sound source identification information DY. FIG. 4 is a view of the configuration of the sound source identification unit 60 in the first embodiment. As illustrated in FIG. 4, the sound source identification unit 60 in the first embodiment has a harmonic property analysis unit 62, a first analysis unit 64, a second analysis unit 66, and a sound source specification unit 68.

The harmonic property analysis unit 62 analyzes which of harmonic and inharmonic sounds the performance sound represented by the performance signal Y is equivalent to, based on the feature quantity F of the performance signal Y. The harmonic property analysis unit 62 in the first embodiment calculates a degree of probability WH that the performance sound is equivalent to a harmonic sound (first degree of probability) and a degree of probability WP that the performance sound is equivalent to an inharmonic sound (second degree of probability).

Specifically, a known pattern recognition unit which discriminates harmonic and inharmonic sounds in the analysis of the feature quantity F is used arbitrarily as the harmonic property analysis unit 62. In the first embodiment, a support vector machine (SVM), which is a typical example of a statistical model using supervised learning, is described as an example of the harmonic property analysis unit 62. That is, the harmonic property analysis unit 62 successively determines which of harmonic and inharmonic sounds the performance sound with the feature quantity F is equivalent to, for each feature quantity F (for each sound generation period P), using a hyperplane decided in advance in machine learning in which multiple sound learning data including harmonic sounds and inharmonic sounds are employed. Then, the harmonic property analysis unit 62 calculates, for example, the proportion of the number of times the performance sound is determined as harmonic sound within a predetermined period (the number of times the performance sound is determined as harmonic sound/the total number of times determination is made within the period), as the degree of probability WH of harmonic sound, and calculates the proportion of the number of times the performance sound is determined as inharmonic sound, as the degree of probability WP of inharmonic sound (WH+WP=1). As understood from the above description, the degree of probability WH has a greater numerical value as the possibility (likelihood) that the performance sound of the performance signal Y is a harmonic sound becomes higher, and the degree of probability WP has a greater numerical value as the possibility that the performance sound is an inharmonic sound becomes higher.

The first analysis unit 64 analyzes which of a plurality of types of harmonic sound sources the sound generation source of the performance sound of the performance signal Y is equivalent to, based on the feature quantity F of the performance signal Y. A harmonic sound source means a sound generation source which generates a harmonic sound (for example, a harmonic musical instrument). In FIG. 4, four types, that is, bass (Bass), guitar (Guitar), male vocalist (male Vo.), and female vocalist (female Vo.), are shown as examples of harmonic sound sources to be candidates of the sound generation source of the performance sound. Specifically, for each of N types (N being a natural number equal to or greater than 2) of harmonic sound sources, the first analysis unit 64 in the first embodiment sets an evaluation value EH (n) (EH(1) to EH (N)) according to the degree of probability that the sound generation source of the performance sound is equivalent to the harmonic sound source.

Figure 5:
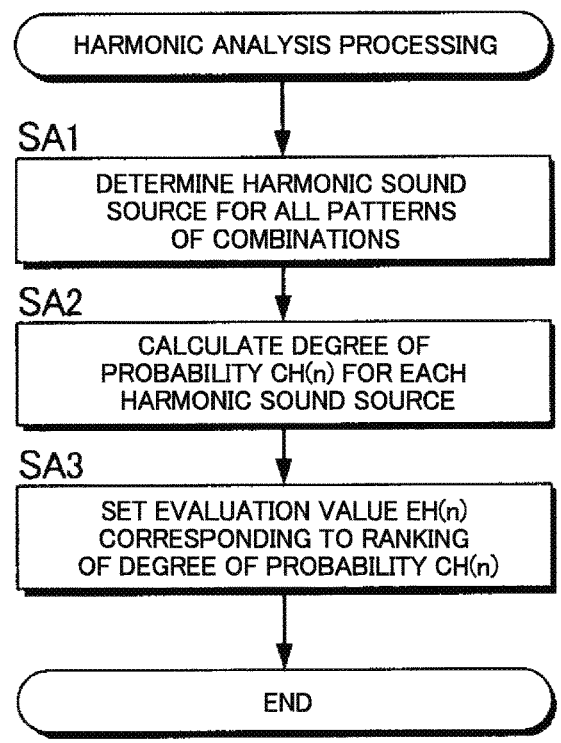
FIG. 5 is a flowchart of harmonic analysis processing.

FIG. 5 is a flowchart of the processing in which the first analysis unit 64 sets the evaluation values EH(1) to EH(N) (hereinafter referred to as "harmonic analysis processing"). The harmonic analysis processing of FIG. 5 is executed every time the extraction of the feature quantity F by the feature quantity extraction unit 50 is carried out (and therefore every sound generation period P).

As the harmonic analysis processing is started, with respect to each of all patterns ($_NC_2$ patterns) of combinations obtained by selecting arbitrary two types of harmonic sound sources from N types of harmonic sound sources set in advance, the first analysis unit 64 determines which of two types of harmonic sound sources included in the combination the sound generation source of the performance sound is equivalent to, using the feature quantity F (SA1). In the determination, a support vector machine in which two types of harmonic sound sources are set as determination candidates is preferably used. That is, the feature quantity F is applied to $_NC_2$ patterns of support vector machines equivalent to the combinations of harmonic sound sources. Thus, for each combination, the sound generation source of the performance sound is selected from two types of harmonic sound sources.

The first analysis unit 64 calculates, for each of the N types of harmonic sound sources, a degree of probability CH(n) (CH(1) to CH(N)) that the sound generation source of the performance sound is equivalent to the harmonic sound source (SA2). The degree of probability CH(n) of one arbitrary (n-th) harmonic sound source is, for example, the proportion of the number of times the sound generation source of the performance sound is determined as equivalent to the n-th harmonic sound source, of the total number of determinations $_NC_2$ (the number of times the sound generation source of the performance sound is determined as equivalent to the n-th harmonic sound source/$_NC_2$). As understood from the above description, the degree of probability CH(n) has a greater numerical value as the possibility (likelihood) that the sound generation source of the performance sound of the performance signal Y is equivalent to the n-th harmonic sound source of the N types of harmonic sound sources becomes higher.

The first analysis unit 64 sets a numerical value (score) corresponding to the ranking of the degree of probability CH(n) calculated for each harmonic sound source, as the evaluation value EH(n), for each of the N types of harmonic sound sources (SA3). Specifically, a numerical value corresponding to the ranking of the degree of probability CH(n) is provided as the evaluation value EH(n) of each harmonic sound source in such a way that the evaluation value EH(n) is a greater numerical value as the degree of probability CH(n) becomes higher. For example, the evaluation value EH(n) of a harmonic sound source placed at the top in descending order of the degree of probability CH(n) is set to a numerical value ε1 (for example, ε1=100); the evaluation value EH(n) of a harmonic sound source with the degree of probability CH(n) placed at the second place is set to a numerical value ε2 which is smaller than the numerical value ε1 (for example, ε2=80); the evaluation value EH(n) of a harmonic sound source with the degree of probability CH(n) placed at the third place is set to a numerical value ε3 which is smaller than the numerical value ε2 (for example, ε3=60); and the evaluation value EH(n) of the rest of the harmonic sound sources lower than a predetermined ranking is set to a minimum value (for example, 0); or the like. As understood from the above description, the evaluation value EH(n) is a greater numerical value as the possibility that the sound generation source of the performance sound of the performance signal Y is equivalent to the n-th harmonic sound source of the N types of harmonic sound sources becomes higher. This is a preferable example of the harmonic analysis processing.

The second analysis unit 66 of FIG. 4 analyzes which of a plurality of types of inharmonic sound sources the sound generation source of the performance sound of the performance signal Y is equivalent to, based on the feature quantity F of the performance signal Y. An inharmonic sound source means a sound generation source which generates an inharmonic sound (for example, an inharmonic musical instrument such as a percussion instrument or the like). In FIG. 4, five types, that is, bass drum (Kick), snare drum (Snare), hi-hat (Hi-Hat), floor tom (F-Tom), and cymbal (Cymbal), are shown as examples of inharmonic sound sources to be candidates of the sound generation source of the performance sound. Specifically, the second analysis unit 66 in the first embodiment sets, for each of M types (M being a natural number equal to or greater than 2) of inharmonic sound sources, an evaluation value EP(m) (EP(1) to EP(M)) according to the degree of probability that the sound generation source of the performance sound is equivalent to the inharmonic sounds source. The number of types N of harmonic sound sources and the number of types M of inharmonic sound sources may be different from or the same as each other.

The setting of the M evaluation values EP(1) to EP(M) by the second analysis unit 66 (inharmonic analysis processing) is similar to the harmonic analysis processing illustrated in FIG. 5 (the setting of the evaluation value EH(n) by the first analysis unit 64). Specifically, with respect to each of all patterns ($_MC_2$ patterns) of combinations obtained by selecting two types from M types of inharmonic sound sources, the second analysis unit 66 determines which of two types of inharmonic sound sources included in the combination the sound generation source of the performance sound is equivalent to, and calculates a degree of probability CP(m) that the sound generation source of the performance sound is equivalent to the m-th inharmonic sound source, for each inharmonic sound source. In the determination of the inharmonic sound source, a support vector machine is preferably used, as in the determination of the harmonic sound source in the harmonic analysis processing.

The second analysis unit 66 then sets a numerical value corresponding to the ranking of the degree of probability CP(m) as the evaluation value EP(m), for each of the M types of inharmonic sound sources. As the evaluation value EP(m) of an inharmonic sound source with the degree of probability CP(m) placed at an arbitrary ranking, a numerical value equivalent to the evaluation value EH(n) of a harmonic sound source with the degree of probability CH(n) placed at the same ranking is provided. Specifically, the evaluation value EP(m) of an inharmonic sound source placed at the top in descending order of the degree of probability CP(m) is set to a numerical value ε1. The evaluation value EP(m) of an inharmonic sound source with the degree of probability CP(m) placed at the second place is set to a numerical value ε2. The evaluation value EP(m) of an inharmonic sound source with the degree of probability CP(m) placed at the third place is set to a numerical value ε3. The evaluation value EP(m) of the rest of the inharmonic sound sources lower than a predetermined ranking is set to a minimum value (for example, 0). Therefore, the evaluation value EP(m) is a greater numerical value as the possibility that the sound generation source of the performance sound of the performance signal Y is equivalent to the m-th inharmonic sound source of the M types of inharmonic sound sources becomes higher.

One arbitrary feature quantity F extracted from the performance signal Y by the feature quantity extraction unit 50 is made up of a plurality of characteristic values f including a characteristic value f1 (first characteristic value) and a characteristic value f2 (second characteristic value) which are different from each other, as described above. The first analysis unit 64 in the first embodiment analyzes the degree of probability CH(n) that the sound generation source of the performance sound is equivalent to each of the N types of harmonic sound sources, using the characteristic value f1 of the feature quantity F. Meanwhile, the second analysis unit 66 analyzes the degree of probability CP(m) that the sound generation source of the performance sound is equivalent to each of the M types of inharmonic sound sources, using the characteristic value f2 of the feature quantity F. That is, the feature quantity F (characteristic value f1) used by the first analysis unit 64 to calculate the degree of probability CH(n) of the harmonic sound source and the feature quantity F (characteristic value f2) used by the second analysis unit 66 to calculate the degree of probability CP(m) of the inharmonic sound source are different from each other.

Specifically, in the calculation of the degree of probability CH(n) by the first analysis unit 64, the characteristic value f1, which varies prominently from one type of harmonic sound source to another, is used. For example, the characteristic value f1 such as MFCC representing the tone, the intensity ratio of a harmonic component to a fundamental tone component, or the like is preferably used to calculate the degree of probability CH(n) of harmonic sound. Meanwhile, in the calculation of the degree of probability CP(m) by the second analysis unit 66, the characteristic value f2, which varies prominently from one type of inharmonic sound source to another, is used. For example, the characteristic value f2 such as the degree of steepness of a sound rise, the number of zero crossings, or the like is preferably used to calculate the degree of probability CP(m) of inharmonic sound. The characteristic value f1 used by the first analysis unit 64 and the characteristic value f2 used by the second analysis unit 66 can made partly the same.

The sound source specification unit 68 of FIG. 4 specifies the type of the sound generation source of the performance signal Y according to the results of the foregoing analysis by the harmonic property analysis unit 62, the first analysis unit 64, and the second analysis unit 66. The specification of the type of the sound generation source is executed every sound generation period P. As illustrated in FIG. 4, the sound source specification unit 68 in the first embodiment includes a multiplication unit 682, a multiplication unit 684, and a selection processing unit 686.

The multiplication unit 682 multiplies each of the N evaluation values EH(1) to EH(N) set for the N types of harmonic sound sources by the first analysis unit 64, by the degree of probability WH of harmonic sound analyzed by the harmonic property analysis unit 62, and thus calculates N identification indicators R (R=EH(n)×WH). Meanwhile, the multiplication unit 684 multiplies each of the M evaluation values EP(1) to EP(M) set for the M types of inharmonic sound sources by the second analysis unit 66, by the degree of probability WP of inharmonic sound analyzed by the harmonic property analysis unit 62, and thus calculates M identification indicators R (R=EP(m)×WP). With the processing by the multiplication unit 682 and the multiplication unit 684, the identification indicator R is calculated for each of K types (K=N+M) of candidate sound sources including the N types of harmonic sound sources and the M types of inharmonic sound sources. As understood from the above description, the degree of probability WH is equivalent to a weighted value on each evaluation value EH(n) of harmonic sound, and the degree of probability WP is equivalent to a weighted value on each evaluation value EP(m) of inharmonic sound. The identification indicator R of the harmonic sound source becomes relatively dominant as the degree of probability WH that the performance sound is equivalent to a harmonic sound becomes higher. The identification indicator R of the inharmonic sound source becomes relatively dominant as the degree of probability WP that the performance sound is equivalent to an inharmonic sound becomes higher.

The selection processing unit 686 specifies the type of the sound generation source of the performance sound of the performance signal Y according to the K identification indicators R calculated by the multiplication unit 682 and the multiplication unit 684, and generates the sound source identification information DY (for example, musical instrument name) representing the type of the sound generation source. Specifically, the selection processing unit 686 selects one type of candidate sound source with the largest identification indicator R from among the K types of candidate sound sources, as the sound generation source of the performance sound, and generates the sound source identification information DY designating the selected candidate sound source. That is, the type of the sound generation source of the performance sound of the performance signal Y is identified.

Figure 6:
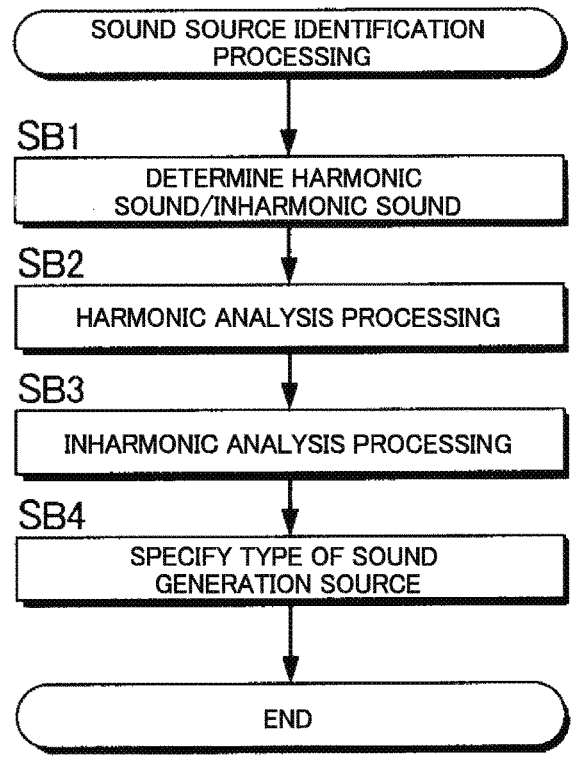
FIG. 6 is a flowchart of sound source identification processing.

FIG. 6 is a flowchart of processing in which the sound source identification unit 60 in the first embodiment specifies the type of the sound generation source of the performance sound with respect to the performance signal Y of one arbitrary system (hereinafter referred to as "sound source identification processing"). For each of a plurality of performance signals Y, the sound source identification processing of FIG. 6 is executed every time the extraction of the feature quantity F by the feature quantity extraction unit 50 is carried out (every sound generation period P).

As the sound source identification processing is started, the harmonic property analysis unit 62 analyzes which of harmonic and inharmonic sounds the performance sound represented by the performance signal Y is equivalent to, based on the feature quantity F of the performance signal Y (SB1). Meanwhile, the first analysis unit 64 calculates the evaluation value EH(n) (EH(1) to EH(N)) for each of the N types of harmonic sound sources by the harmonic analysis processing described with reference to FIG. 5 (SB2). The second analysis unit 66 calculates the evaluation value EP(m) (EP(1) to EP(M)) for each of the M types of inharmonic sound sources by the inharmonic analysis processing similar to the harmonic analysis processing (SB3). Then, the sound source specification unit 68 specifies the type of the sound generation source of the performance signal Y according to the results of the analysis by the harmonic property analysis unit 62, the first analysis unit 64, and the second analysis unit 66 (SB4). The order of the harmonic property analysis by the harmonic property analysis unit 62, the harmonic analysis processing by the first analysis unit 64, and the inharmonic analysis processing by the second analysis unit 66 is arbitrary. For example, it is possible that the harmonic property analysis unit 62 analyzes the harmonic property after the execution of the harmonic analysis processing (SB2) and the inharmonic analysis processing (SB3). A specific example of the configuration and operation of the sound analysis unit 20 is as described above.

As described above, in the first embodiment, harmonic and inharmonic sounds are discriminated from each other and the type of the sound generation source of the performance sounds is thus specified. Specifically, the type of the sound generation source of the performance sound is specified, using the result of the analysis by the harmonic property analysis unit 62 of the degree of probability (WH, WP) that the performance sound is equivalent to each of harmonic and inharmonic sounds, the result of the analysis by the first analysis unit 64 of the degree of probability CH(n) that the sound generation source of the performance sound is equivalent to each of the N types of harmonic sound sources, and the result of the analysis by the second analysis unit 66 of the degree of probability CP(m) that the sound generation source of the performance sound is equivalent to each of the M types of inharmonic sound sources. Therefore, it is possible to accurately specify the type of the sound generation source of the performance sound, compared with a configuration in which the type of the sound generation source is specified without discriminating harmonic and inharmonic sounds. The embodiment is also advantageous in that the identification of harmonic sound/inharmonic sound by the reproduction control unit 30 is also possible for a sound generation source that is not learned yet by the first analysis unit 64 or the second analysis unit 66.

Also, in the first embodiment, the identification indicator R is calculated for each of the K types of candidate musical instruments (N types of harmonic sound sources and M types of inharmonic sound sources), by the multiplication of the degree of probability WH that the performance sound is equivalent to a harmonic sound and the evaluation value EH(n) of each harmonic sound source, and the multiplication of the degree of probability WP that the performance sound is equivalent to an inharmonic sound and the evaluation value EP(m) of each inharmonic sound source. The type of the sound generation source of the performance sound is specified according to each identification indicator R. That is, the identification indicator R of the harmonic sound source becomes relatively dominant as the degree of probability WH that the performance sound is equivalent to a harmonic sound becomes higher. The identification indicator R of the inharmonic sound source becomes relatively dominant as the degree of probability WP that the performance sound is equivalent to an inharmonic sound becomes higher. Therefore, the embodiment is advantageous in that the type of the sound generation source of the performance sound can be specified easily and accurately by the comparison of the K identification indicators R.

Incidentally, for example, in a configuration where the degree of probability CH(n) that the sound generation source of the performance sound is equivalent to a harmonic sound source is used as the evaluation value EH(n) and where the degree of probability CP(m) that the sound generation source of the performance sound is equivalent to an inharmonic sound source is used as the evaluation value EP(m) (hereinafter referred to as "comparative example"), the numerical value of the evaluation value EH(n) depends on the number of types of harmonic sound sources N, and the numerical value of the evaluation value EP(m) depends on the number of types of inharmonic sound sources M. For example, the degree of probability CH(n) has a smaller numerical value as the number of types of harmonic sound sources N becomes greater. Therefore, if the number of types of harmonic sound sources N and the number of types of inharmonic sound sources M are different from each other, the problem of being unable to properly compare the evaluation value EH(n) with the evaluation value EP(m) arises. In the first embodiment, a numerical value corresponding to the ranking of the degree of probability CH(n) that the sound generation source of the performance sound is equivalent to a harmonic sound source is set as the evaluation value EH(n) for each harmonic sound source, and a numerical value corresponding to the ranking of the degree of probability CP(m) that the sound generation source of the performance sound is equivalent to an inharmonic sound source is set as the evaluation value EP(m) for each inharmonic sound source. That is, the evaluation value EH(n) is set to a numerical value that does not depend on the number of types of harmonic sound sources N, and the evaluation value EP(m) is set to a numerical value that does not depend on the number of types of inharmonic sound sources M. Thus, the first embodiment is advantageous in that the evaluation value EH(n) and the evaluation value EP(m) can be properly compared with each other, for example, even if the number of types of harmonic sound sources N and the number of types of inharmonic sound sources M are different from each other. It can also be said that the restraint on the number of types of harmonic sound sources N and the number of types of inharmonic sound sources M is relaxed. However, the above comparative example, too, is included in the scope of the invention.

Also, in the first embodiment, the feature quantity F (characteristic value f1) used by the first analysis unit 64 to calculate the degree of probability CH(n) of the harmonic sound source and the feature quantity F (characteristic value f2) used by the second analysis unit 66 to calculate the degree of probability CP(m) of the inharmonic sound source are different from each other. Specifically, for example, the characteristic value f1 suitable for the identification of a harmonic sound is used for the calculation of the degree of probability CH(n) by the first analysis unit 64, and the characteristic value f2 suitable for the identification of an inharmonic sound is used for the calculation of the degree of probability CP (m) by the second analysis unit 66. Therefore, the embodiment is advantageous in that the sound generation source of the performance sound can be specified accurately, compared with a configuration where the same type of feature quantity is used for the calculation of the degree of probability CH(n) of the harmonic sound source and the calculation of the degree of probability CP(m) of the inharmonic sound source. However, the first analysis unit 64 and the second analysis unit 66 can use a common feature quantity F.

<Reproduction Control Unit 30>

The reproduction control unit 30 of FIG. 1 mixes a plurality of recorded signals XA with the performance signal Y according to the result of the analysis by the sound analysis unit 20 described above (sound source identification information DY generated by the sound source identification unit 60) and thus generates the sound signal XB. FIG. 7 is a view of the configuration of the reproduction control unit 30. As illustrated in FIG. 7, the reproduction control unit 30 in the first embodiment has a sound processing unit 32, a sound volume adjustment unit 34, and a mixing processing unit 36. The order of the positions of the sound processing unit 32 and the sound volume adjustment unit 34 can be reversed.

The sound processing unit 32 executes various kinds of sound processing on each recorded signal XA stored in the storage device 124 and the performance signal Y supplied from the performance device 13. For example, various kinds of sound processing, such as effect application processing (effector) to apply various sound effects like reverberation effect and strain effect, characteristic adjustment processing (equalizer) to adjust the sound volume for each frequency band, and localization adjustment processing (panning) to adjust the position where a sound image is localized, are executed on each recorded signal XA and the performance signal Y by the sound processing unit 32.

The sound volume adjustment unit 34 adjusts the sound volume (mixing ratio) of each recorded signal XA and the performance signal Y after the processing by the sound processing unit 32. For example, the sound volume adjustment unit 34 in the first embodiment adjusts the sound volume in response to an instruction from the user and also reduces the sound volume of a recorded signal XA (hereinafter referred to as "target signal") corresponding to the type of the sound generation source of the performance sound specified by the sound analysis unit 20 (sound source identification unit 60), of the plurality of recorded signals XA. The sound volume adjustment unit 34 in the first embodiment changes the sound volume of the target signal XA to zero (mute).

Relation information G of FIG. 8 is used for the selection of the target signal XA by the sound volume adjustment unit 34. The relation information G is information which designates the correspondence between the sound generation source of a recorded sound and the sound generation source of a performance sound. The relation information G is prepared in advance and stored in the storage device 124. Specifically, as illustrated in FIG. 8, the relation information G is a data table which associates each piece of sound source identification information DX (DX1, DX2, . . . ) that can be added to (associated with) the recorded signal XA, with each piece of sound source identification information DY (DY1, DY2, . . . ) that can be specified from the performance signal Y.

The sound volume adjustment unit 34 refers to the relation information G stored in the storage device 124 and selects the recorded signal XA of the sound generation source associated with the sound generation source of the performance sound specified by the sound source identification unit 60 in the relation information G, as the target signal XA. Specifically, the sound volume adjustment unit 34 searches the relation information G for the sound source identification information DX corresponding to the sound source identification information DY generated by the sound source identification unit 60 and reduces the sound volume of the recorded signal XA with this sound source identification information DX added thereto, as the target signal XA. For example, the relation information G designating the correspondence between the sound source identification information DX of the "singing voice" and the sound source identification information DY of the "sax" is considered. When the user plays the "sax" as an example of the performance device 13, the recorded signal XA of the "singing voice" is selected as the target signal XA from among the plurality of recorded signals XA and its sound volume is reduced (for example, muted). In the reduction of the sound volume, it may be configured to gradually reduce the sound volume.

The selection of a target signal XA and the adjustment of the sound volume of the target signal XA by the sound volume adjustment unit 34 are executed repetitively, for example, on a predetermined cycle. Therefore, during a period when the user has not started playing the performance device 13, all the recorded signals XA are reproduced in a proper sound volume. When the user has started playing the performance device 13, the sound volume of the target signal XA is reduced. Also, when the user has finished playing the performance device 13, the sound volume of the target signal XA is increased again.

For example, the correspondence between sound generation sources that are musically incompatible is designated in the relation information G. For example, in the relation information G, a combination of two types of sound generation sources that causes the listener to feel that something is wrong when a reproduced sound and a recorded sound with similar sound characteristics are reproduced in parallel with each other, or a combination of two types of sound generation sources that causes the listener to feel that something is wrong when a reproduced sound and a recorded sound with very different musical expressions or impressions from each other are reproduced in parallel with each other is designated. Therefore, the sound volume is reduced for the target signal XA of a sound generation source that tends to cause the listener to feel that something is wrong when reproduced in parallel with the sound generation source of the performance sound of the performance signal Y.

The mixing processing unit 36 of FIG. 7 mixes the plurality of recorded signals XA and the performance signal Y after the processing by the sound processing unit 32 and the sound volume adjustment unit 34 and thus generates the sound signal XB. As the result of the above processing, a reproduced sound formed by replacing a part of a plurality of playing parts of a piece of music (recorded sound corresponding to the target signal XA) with the performance sound played by the user is reproduced from the sound emission device 16. That is, the reproduction control unit 30 in the first embodiment realizes automatic mixing in which the result of the identification of the sound generation source by the sound source identification unit 60 is reflected.

As described above, in the first embodiment, the sound volume of the recorded signal XA corresponding to the type of the sound generation source of the performance sound represented by the performance signal Y, of the plurality of recorded signals XA, is reduced. Therefore, it is possible to facilitate a performance in parallel with the reproduction of the plurality of recorded signals XA (to perform without being obstructed by the reproduction of the recorded sound), compared with a configuration where the control of the sound volume of the recorded signal XA corresponding to the type of the sound generation source of the performance sound is not executed. Particularly, in the first embodiment, the sound volume of the recorded signal XA (target signal XA) of the sound generation source associated with the sound generation source of the performance sound by the relation information G, of the plurality of recorded signals XA, is reduced. Therefore, it is possible to facilitate a performance in parallel with the reproduction of the plurality of recorded signals XA by, for example, designating the correspondence between sound generation sources that are musically incompatible in the relation information G in advance.

<Second Embodiment>

A second embodiment of the invention will be described. In each embodiment described below, for elements with operations and functions similar to those in the first embodiment, the reference signs used in the description of the first embodiment are used and detailed description of each element is omitted where appropriate.

Figure 9:
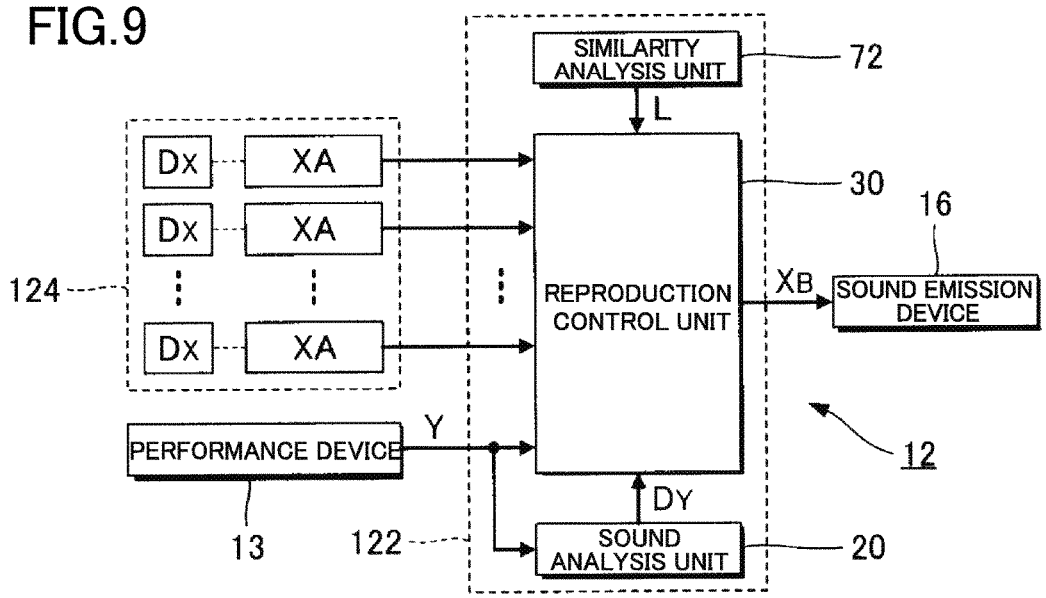
FIG. 9 is a view of the configuration of a sound processing device according to a second embodiment.

FIG. 9 is a view of the configuration of a sound processing device 12 in the second embodiment. As illustrated in FIG. 9, the sound processing device 12 in the second embodiment has a configuration including similar elements to those in the first embodiment (sound analysis unit 20 and reproduction control unit 30) and additionally including a similarity analysis unit 72. The similarity analysis unit 72 is realized by the controller 122 executing a program stored in the storage device 124, similarly to the sound analysis unit 20 and the reproduction control unit 30.

The similarity analysis unit 72 of FIG. 9 analyzes similarity in the content of sound between each of a plurality of recorded signals XA stored in the storage device 124 and the performance signal Y supplied from the performance device 13. The content of sound to be a target of analysis by the similarity analysis unit 72 is a musical element, for example, a melody, which as an array of a plurality of pitches, a rhythm, which means temporal sound variation (for example, time series of beat points), or the like. For each of the plurality of recorded signals XA, the similarity analysis unit 72 calculates a degree of similarity (for example, distance or correlation) L in the content of sound between the recorded signal XA and the performance signal Y. In the analysis of the similarity in the content of sound, a known technique can be arbitrarily employed. The degree of similarity L can be calculated, for example, according to the degree to which the pitches of the recorded signal XA and the performance signal Y in the sound generation periods P that are close to each other in time are similar to each other (that is, the degree to which the melodies of the recorded sound and the performance sound are similar to each other) or the degree to which the positions or the numbers of the sound generation periods P on the time axis of the recorded signal XA and the performance signal Y are similar to each other (that is, the degree to which the rhythms of the recorded sound and the performance sound are similar to each other). Also, a known technique of synchronization analysis to analyze the correspondence on the time axis between the recorded signal XA and the performance signal Y can be used for the analysis by the similarity analysis unit 72.

The sound volume adjustment unit 34 (reproduction control unit 30) in the second embodiment selects, as the target signal XA, the recorded signal XA determined by the similarity analysis unit 72 as similar to the performance signal Y in the content of sound from among the plurality of recorded signals XA after the processing by the sound processing unit 32, and reduces (for example, mutes) the sound volume thereof. Specifically, the sound volume adjustment unit 34 selects, as the target signal XA, the recorded signal XA having the degree of similarity L of a maximum value (that is, the recorded signal XA having content of sound that is the most similar to the performance signal Y) from among the plurality of recorded signals XA. The calculation of the degree of similarity L by the similarity analysis unit 72 and the adjustment of the sound volume of the target signal XA by the sound volume adjustment unit 34 are executed repetitively, for example, on a predetermined cycle. Therefore, during a period when the user has not started playing the performance device 13, all the recorded signals XA are reproduced in a proper sound volume. When the user has started playing the performance device 13, the sound volume of the target signal XA similar to the performance sound of the performance device 13 is reduced. Also, when the user has finished playing the performance device 13, the sound volume of the target signal XA is increased again. The operation executed by the mixing processing unit 36 to generate the sound signal XB based on the plurality of recorded signals XA and the performance signal Y after the processing by the sound processing unit 32 and the sound volume adjustment unit 34 is similar to that in the first embodiment.

In the second embodiment, the sound volume of a recorded signal (target signal) XA having content of sound similar to the performance signal Y, of a plurality of recorded signals XA, is reduced. Therefore, the user can perform a desired playing part without being obstructed by a recorded sound having the content of sound similar to the performance sound, such as a recorded sound of the same playing part in a piece of music. Also, compared with the first embodiment, in which the correspondence between the sound generation source of the recorded sound and the sound generation source of the performance sound is designated in the relation information G in advance, the second embodiment is advantageous in that there is no need to register the correspondence between the sound generation sources in advance and in that even the sound volume of the recorded signal XA of an unregistered sound generation source can be properly reduced in consideration of its relation with the performance signal Y.

<Third Embodiment>

Figure 10:
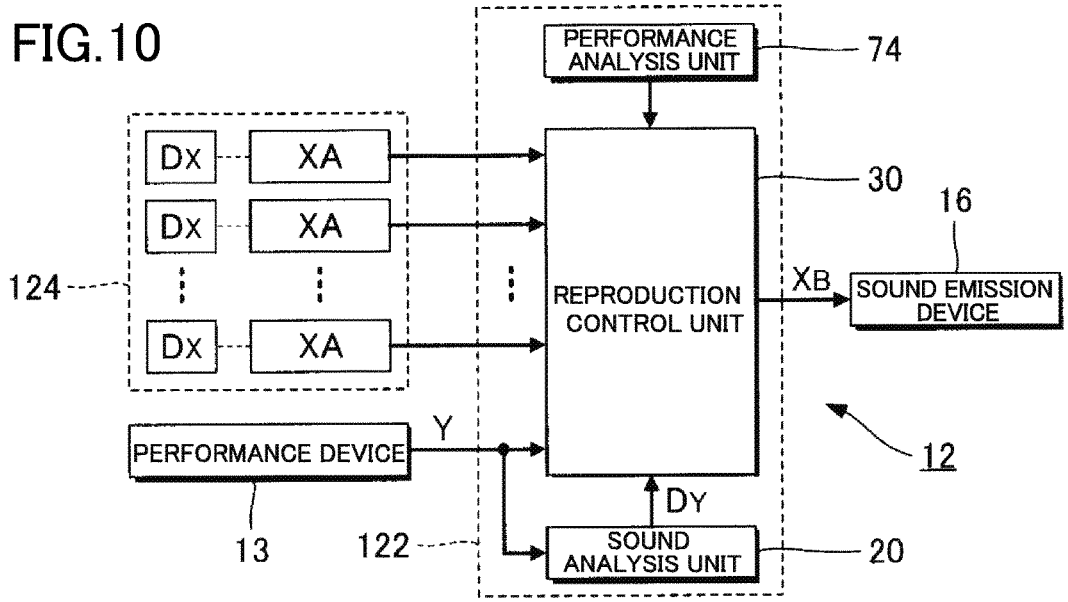
FIG. 10 is a view of the configuration of a sound processing device according to a third embodiment.

FIG. 10 is a view of the configuration of a sound processing device 12 in a third embodiment. As illustrated in FIG. 10, the sound processing device 12 in the third embodiment has a configuration including similar elements to those in the first embodiment (sound analysis unit 20 and reproduction control unit 30) and additionally including a performance analysis unit 74. The performance analysis unit 74 is realized by the controller 122 executing a program stored in the storage device 124, similarly to the sound analysis unit 20 and the reproduction control unit 30.

The performance analysis unit 74 of FIG. 10 analyzes which of melody and accompaniment sounds the performance sound represented by the performance signal Y is equivalent to. For example, there is a general tendency for a melody sound to be played often as a single sound (single pitch) and for an accompaniment sound to be played as a chord. Considering the above tendency, the performance analysis unit 74 presumes that the performance sound is a melody sound if the frequency of a single sound in the performance signal Y is high, and presumes that the performance sound is an accompaniment sound if the frequency of a chord in the performance signal Y is high. It is possible to determine whether the performance sound is a single sound or a chord, for example, by counting the total number of peaks of frequency spectrum. That is, the performance analysis unit 74 determines the performance sounds as a single sound if the total number of peaks of frequency spectrum is smaller than a threshold, and determines the performance sound as a chord if the total number of peaks is greater than the threshold. Also, the performance analysis unit 74 may calculate a 12-dimensional chroma vector obtained by adding up the intensity of the performance signal Y of each of 12 kinds of scale sounds over a plurality of octaves, and then determine the performance sound as a single sound if a number of elements having a value larger than a threshold of the 12 elements of the chrome vector is small, and determine the performance sound as a chord if a number of elements having a value larger than the threshold of the 12 elements of the chrome vector is large.

The sound volume adjustment unit 34 (reproduction control unit 30) in the third embodiment selects a target signal XA from a plurality of recorded signals XA by the same method as in the first embodiment and decides whether to reduce the sound volume of the target signal XA or not, based on the result of the analysis by the performance analysis unit 74. When the user plays a melody sound, the reproduced sounds of other playing parts can particularly tend to obstruct the user. However, there is a general tendency for the user to be able to play an accompaniment sound relatively easily even when there are reproduced sounds of other playing parts. Considering the above tendency, the sound volume adjustment unit 34 in the third embodiment reduces the sound volume of the target signal XA if the performance analysis unit 74 determines that the performance sound of the performance signal Y is a melody sound, but the sound volume adjustment unit 34 does not reduce the sound volume of the target signal XA if the performance analysis unit 74 determines that the performance sound of the performance signal Y is an accompaniment sound. The operation executed by the mixing processing unit 36 to generate the sound signal XB based on the plurality of recorded signals XA and the performance signal Y after the processing by the sound processing unit 32 and the sound volume adjustment unit 34 is similar to that in the first embodiment.

In the third embodiment, whether to reduce the sound volume of the recorded signal (target signal) XA or not is decided, based on which of melody and accompaniment sounds the performance sound is equivalent to. Therefore, the third embodiment is advantageous in that the possibility that the sound volume of the recorded signal XA is reduced more than necessary even when the performance sound and the recorded sound are compatible, as in the case where one of the performance sound and the recorded sound is a melody sound while the other is an accompaniment sound, can be reduced.

<Modifications>

The embodiments described above can be modified in various ways. Specific forms of modification will be described below. Two or more forms arbitrarily chosen from the description below can be combined together unless these forms contradict each other.

(1) In the foregoing embodiments, the harmonic property analysis unit 62 discriminates harmonic and inharmonic sounds by the support vector machine. However, the method for discriminating harmonic and inharmonic sounds by the harmonic property analysis unit 62 is not limited to the above example. For example, a method for discriminating the performance sound between harmonic and inharmonic sounds using mixed normal distribution that expresses the distribution trend of the feature quantity F of each of harmonic and inharmonic sounds, or a method for discriminating the performance sound between harmonic and inharmonic sounds by clustering using the k-means algorithm, may be employed. Similarly, the method for estimating the type of the sound generation source of the performance sound by each of the first analysis unit 64 and the second analysis unit 66 is not limited to the support vector machine described in the foregoing embodiments. A known pattern recognition technique can be arbitrarily employed.

(2) In the foregoing embodiments, the N evaluation values EH(1) to EH(N) are multiplied by the degree of probability WH of harmonic sound analyzed by the harmonic property analysis unit 62, and the M evaluation values EP(1) to EP(M) are multiplied by the degree of probability WP of inharmonic sound. However, the method for reflecting the degree of probability WH of harmonic sound and the degree of probability WP of inharmonic sound on the type of the sound generation source of the recorded signal XA is not limited to the above example. For example, which of harmonic and inharmonic sounds the performance sound of the recorded signal XA is equivalent to may be determined, based on the degree of probability WH and the degree of probability WP, and the sound source specification unit 68 may specify the type of the sound generation source, selectively using either the N evaluation values EH(1) to EH(N) or the M evaluation values EP(1) to EP(M) based on the result of the determination of the harmonic property.

Specifically, the harmonic property analysis unit 62 determines the performance sound as a harmonic sound if the degree of probability WH is higher than the degree of probability WP, and determines the performance sound as an inharmonic sound if the degree of probability WP is higher than the degree of probability WH. If it is determined that the performance sound is a harmonic sound, the sound source specification unit 68 specifies, as the type of the sound generation source, the harmonic sound source corresponding to the maximum value of the N evaluation values EH(1) to EH(N) calculated by the first analysis unit 64. Meanwhile, if it is determined that the performance sound is an inharmonic sound, the sound source specification unit 68 specifies, as the type of the sound generation source, the inharmonic sound source corresponding to the maximum value of the M evaluation values EP(1) to EP(M) calculated by the second analysis unit 66. The configuration described above may be paraphrased as a configuration where one of the degree of probability WH and the degree of probability WP is set to 1 while the other is set to 0, in the foregoing embodiments. Also, a configuration where the inharmonic analysis processing (calculation of the M evaluation values EP(1) to EP(M)) by the second analysis unit 66 is omitted if the harmonic property analysis unit 62 determines the performance sound as a harmonic sound, and a configuration where the harmonic analysis processing (calculation of the N evaluation values EH(1) to EH(N)) by the first analysis unit 64 is omitted if the harmonic property analysis unit 62 determines the performance sound as an inharmonic sound, can be employed.

As understood from the foregoing description, the sound source specification unit 68 is expressed inclusively as an element that specifies the type of the sound generation source of the performance sound based on the results of the analysis by the harmonic property analysis unit 62, the first analysis unit 64, and the second analysis unit 66. In the invention, both the results of the analysis by the first analysis unit 64 and the second analysis unit 66 may be used, or only the result of the analysis by one of these may be used.

Figure 11:
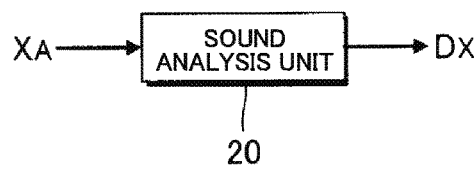
FIG. 11 is an explanatory view of the generation of source identification information of a recorded sound according to a modification.

(3) In the foregoing embodiments, a configuration in which the sound source identification information DX is added in advance to each of a plurality of recorded signals XA stored in the storage device 124 is described as an example. However, the sound analysis unit 20 (sound source identification unit 60) described in the first embodiment can be used in the specification of the sound generation source of the recorded sound represented by each recorded signal XA (generation of the sound source identification information DX). Specifically, as illustrated in FIG. 11, each of the plurality of recorded signals XA is supplied to the sound analysis unit 20 before the user plays the performance device 13 (for example, in parallel with the recording of the recorded sound). The sound analysis unit 20 executes processing similar to the processing executed on the performance signal Y in the first embodiment, on each of the plurality of recorded signals XA, and thus generates the sound source identification information DX for each recorded signal XA. The sound source identification information DX generated for each recorded signal XA by the sound analysis unit 20 (sound source identification unit 60) is added to the recorded signal XA, which is then stored in the storage device 124.

(4) In the foregoing embodiments, the sound volume adjustment unit 34 selectively reduces the sound volume of one recorded signal XA of a plurality of recorded signals XA. However, it is possible to reduce the sound volume of two or more recorded signals XA according to the result of the analysis by the sound analysis unit 20. For example, a configuration such that a plurality of pieces of sound source identification information DX of a target sound are associated with one arbitrary piece of sound source identification information DY in the relation information G of the first embodiment, or a configuration such that the sound volume of two or more recorded signals XA placed at high positions in descending order of the degree of similarity L is reduced in the configuration of the second embodiment, can be employed.

(5) In the foregoing embodiments, the case of reproducing a plurality of recorded signals XA is described as an example. However, the configuration where the sound volume of the recorded signal XA corresponding to the type of the sound generation source of the performance sound specified by the sound analysis unit 20 (sound source identification unit 60) is reduced can also be employed in the case of reproducing a single recorded signal XA. Specifically, when the sound generation source of a recorded signal XA corresponds to the type of the sound generation source specified by the sound source identification unit 60, the reproduction control unit 30 reduces the sound volume of the recorded signal XA. For example, in a situation where the performance device 13 (sound receiving device) generates a performance signal Y of a singing voice of the user while a recorded signal XA of a singing voice recorded in advance is reproduced, the reproduction control unit 30 reduces the sound volume of the recorded signal XA when the sound generation source of the performance signal Y (user) is specified. Thus, the user can sing, using the recorded signal XA as a guide vocal. Also, for example, in a situation where the performance device 13 (for example, a musical instrument such as a keyboard harmonica or the like) generates a performance signal Y of a performance sound by the user while a recorded signal XA generated by recording a model performance sound (for example, a performance sound by a teacher) of a musical instrument such as a keyboard harmonica or the like is reproduced, the reproduction control unit 30 reduces the sound volume of the recorded signal XA when the sound generation source of the performance signal Y is specified. Thus, it is possible to effectively practice playing the musical instrument while checking the performance sound of the recorded signal XA at any time. As understood from the foregoing description, the reproduction control unit 30 is expressed inclusively as an element that reduces the sound volume of a recorded signal XA when the sound generation source of the recorded signal XA corresponds to the type of the sound generation source specified by the sound source identification unit 60. The total number of the recorded signals XA (singular/plural) is arbitrary in the invention.

(6) The sound processing device 12 can also be realized by a server device which communicates with a terminal device (for example, a mobile phone or a smartphone) via a communication network such as a mobile communication network, the internet, or the like. Specifically, the sound processing device 12 generates, by processing similar to the foregoing embodiments, a sound signal XB from a plurality of recorded signals XA received from a terminal device via a communication network and transmits the sound signal XB to the terminal device. In a configuration where the feature quantity F for each sound generation period P of the recorded signal XA is transmitted from the terminal device to the sound processing device 12 (for example, a configuration where the terminal device has the sound generation period detection unit 40 and the feature quantity extraction unit 50), the sound generation period detection unit 40 and the feature quantity extraction unit 50 are omitted from the sound analysis unit 20 of the sound processing device 12.

(7) The sound processing device 12 described as an example in the foregoing embodiments is realized by the collaboration of the controller 122 and a program, as described above. The program can be provided in the form of being stored in a computer-readable recording medium and can be installed in a computer. The recording medium is, for example, a non-transitory recording medium. An optical recording medium (optical disc) such as CD-ROM or the like is a preferable example. However, the recording medium can include a recording medium of an arbitrary known form such as a semiconductor recording medium, a magnetic recording medium, or the like. Also, the program described above can be provided in the form of being distributed via a communication network and can be installed in a computer.

(8) The invention is also specified as an operation method for the sound processing device 12 according to the foregoing embodiments. For example, in a method for reproducing a plurality of recorded signals XA representing recorded sounds generated by different sound generation sources (sound reproduction method), a computer (including not only a single computer but also a computer system made up of a plurality of separate devices) specifies the type of the sound generation source of a performance sound represented by a performance signal Y (sound source identification processing of FIG. 6) and also reduces the sound volume of a recorded signal XA corresponding the specified type of the sound generation source, of the plurality of recorded signals XA.

The sound processing device according to one embodiment of the invention includes: a reproduction control unit that reproduces a recorded signal representing a recorded sound generated by a sound generation source; and a sound source identification unit that specifies the type of a sound generation source of a performance sound represented by a performance signal. The reproduction control unit reduces the sound volume of the recorded signal in a case where the sound generation source of the recorded signal corresponds to the type of the sound generation source specified by the sound source identification unit. With the above configuration, the sound volume of the recorded signal corresponding to the type of the sound generation source of the performance sound represented by the performance signal is reduced. Therefore, it is possible to facilitate a performance in parallel with the reproduction of the recorded signal (to perform without being obstructed by the reproduction of the recorded sound), compared with a configuration where the control of the sound volume of the recorded signal corresponding to the type of the sound generation source of the performance sound is not executed. The performance sound is, for example, musical sounds generated by various musical instruments, a singing voice generated by a vocalist, or the like.

In a preferred embodiment of the invention, the reproduction control unit reproduces a plurality of recorded signals representing recorded sounds generated by different sound generation sources, and reduces the sound volume of a recorded signal corresponding to the type of the sound generation source specified by the sound source identification unit, of the plurality of recorded signals. With the above configuration, the sound volume of the recorded signal corresponding to the type of the sound generation source of the performance sound represented by the performance signal, of the plurality of recorded signals, is reduced. Therefore, it is possible to facilitate a performance in parallel with the reproduction of a plurality of recorded signals (to perform without being obstructed by the reproduction of the recorded sound), compared with a configuration where the control of the sound volume of the recorded signal corresponding to the type of the sound generation source of the performance sound is not executed. The performance sound is, for example, musical sounds generated by various musical instruments, a singing voice generated by a vocalist, or the like.

In the first embodiment of the invention, the reproduction control unit refers to relation information designating a correspondence between a sound generation source of a recorded sound and a sound generation source of a performance sound, and reduces the sound volume of a recorded signal of a sound generation source associated with the sound generation source specified by the sound source identification unit in the relation information, of the plurality of recorded signals. In the first embodiment, the sound volume of the recorded signal of the sound generation source associated with the sound generation source of the performance sound in the relation information, of the plurality of recorded signals is reduced. Therefore, for example, it is possible to facilitate a performance in parallel with the reproduction of a plurality of recorded signals by designating a correspondence between sound generation sources that are musically incompatible in the relation information in advance.

The sound processing device according to the second embodiment of the invention includes a similarity analysis unit which analyzes similarity in the content of sound between each of a plurality of recorded signals and a performance signal. The reproduction control unit reduces the sound volume of a recorded signal determined by the similarly analysis unit as similar to the performance signal in the content of sound, of the plurality of recorded signals. In the second embodiment, the sound volume of the recorded signal determined as similar to the performance signal in the content of sound, of the plurality of recorded signals, is reduced. Therefore, it is possible to perform without being obstructed by a recorded sound similar to the performance sound in the content of sound (for example, a recorded sound of the same part in a piece of music). Also, compared with the foregoing embodiment, in which the correspondence between the sound generation source of the recorded sound and the sound generation source of the performance sound is designated in the relation information in advance, the second embodiment is advantageous in that there is no need to register the correspondence between the sound generation sources in advance and in that even the sound volume of a recorded signal of an unregistered sound generation source can be properly reduced in consideration of its relation with the performance signal.

The sound processing device according to the third embodiment of the invention includes a performance analysis unit which analyzes which of melody and accompaniment sounds the performance sound represented by the performance signal is equivalent to. The reproduction control unit decides whether to reduce the sound volume of the recorded signal or not, based on the result of the analysis by the performance analysis unit. In the third embodiment, whether to reduce the sound volume of the recorded signal or not is decided based on which of melody and accompaniment sounds the performance sound is equivalent to. Therefore, the third embodiment is advantageous in that the possibility that the sound volume of the recorded signal is reduced more than necessary even when the performance sound and the recorded sound are compatible, as in the case where one of the performance sound and the recorded sound is a melody sound while the other is an accompaniment sound, can be reduced.

In the preferred examples in the foregoing embodiments, the sound source identification unit includes: a harmonic property analysis unit that analyzes the degree of probability that the performance sound represented by the performance signal is equivalent to each of harmonic and inharmonic sounds, based on a feature quantity of the performance signal; a first analysis unit that analyzes the degree of probability that the sound generation source of the performance sound is equivalent to each of a plurality of types of harmonic sound sources that generate a harmonic sound, based on a feature quantity of the performance signal; a second analysis unit that analyzes the degree of probability that the sound generation source of the performance sound is equivalent to each of a plurality of types of inharmonic sound sources that generate an inharmonic sound, based on a feature quantity of the performance signal; and a sound source specification unit that specifies the type of the sound generation source of the performance sound according to the results of the analysis by the harmonic property analysis unit, the first analysis unit, and the second analysis unit. In the above embodiment, the type of the sound generation source of the performance sound is specified with discriminating harmonic and inharmonic sounds. Specifically, the type of the sound generation source of the performance sound is specified, using the result of the analysis by the harmonic property analysis unit of the degree of probability that the performance sound is equivalent to each of harmonic and inharmonic sounds, the result of the analysis by the first analysis unit of the degree of probability that the sound generation source of the performance sound is equivalent to each of a plurality of types of harmonic sound sources, and the result of the analysis by the second analysis unit of the degree of probability that the sound generation source of the performance sound is equivalent to each of a plurality of types of inharmonic sound sources. Therefore, it is possible to accurately specify the type of the sound generation source of the performance sound, compared with a configuration in which the type of the sound generation source is specified without discriminating harmonic and inharmonic sounds.

That the reproduction control unit 30 "reduces the sound volume" includes the case of reproducing without inputting the target signal XA to the mixing processing unit 36, as well as the case of reproducing while the sound volume adjustment unit reduces the sound volume of the target signal XA (including the case of reducing to 0).

While there have been described what are at present considered to be certain embodiments of the invention, it will be understood that various modifications may be made thereto, and it is intended that the appended claims cover all such modifications as fall within the true spirit and scope of the invention.

What is claimed is:

1. A sound processing device comprising:
   at least one controller; and
   at least one memory that stores a plurality of instructions, which when executed by the at least one controller, cause the at least one controller to:
   reproduce a plurality of recorded signals representing recorded sounds generated by different sound generation sources;
   specify a type of a sound generation source of a performance sound represented by a performance signal;
   refer to relation information designating a correspondence between a sound generation source of a recorded sound and a sound generation source of a performance sound; and
   reduce a sound volume of a recorded signal of a sound generation source associated with the specified sound generation source in the relation information, of the plurality of recorded signals.

2. The sound processing device according to claim 1, wherein
   the plurality of instructions causes the at least one controller to mix a plurality of signals corresponding to the plurality of recorded signals with the performance signal and reproduce the mixed signal.

3. The sound processing device according to claim 1, wherein
   the plurality of instructions causes the at least one controller to:
   analyze similarity in content of sound between each of the plurality of recorded signals and the performance signal; and
   reduce a sound volume of a recorded signal determined as similar to the performance signal in the content of sound, of the plurality of recorded signals.

4. The sound processing device according to claim 1, wherein
   the plurality of instructions causes the at least one controller to reduce the sound volume of the recorded signal during a performance by a user, and cancel the reduction of the sound volume of the recorded signal after the performance ends.

5. A sound processing device comprising:
at least one controller; and
at least one memory that stores a plurality of instructions, which when executed by the at least one controller, causes the at least one controller to:
reproduce a plurality of recorded signals representing recorded sounds generated by different sound generation sources;
specify a type of a sound generation source of a performance sound represented by a performance signal; and
reduce a sound volume of a recorded signal corresponding to the specified type of the sound generation source, of the plurality of recorded signals, and
wherein the plurality of instructions further causes the at least one controller to:
analyze which of melody and accompaniment sounds the performance sound represented by the performance signal is equivalent to; and
decide whether to reduce the sound volume of the recorded signal or not, based on a result of the analysis.

6. A sound processing method executed by at least one controller, the sound processing method comprising:
reproducing a plurality of recorded signals representing recorded sounds generated by different sound generation sources;
specifying a type of a sound generation source of a performance sound represented by a performance signal; referring to relation information designating a correspondence between a sound generation source of a recorded sound and a sound generation source of a performance sound; and
reducing a sound volume of a recorded signal of a sound generation source associated with the specified sound generation source in the relation information, of the plurality of recorded signals.

7. The sound processing method according to claim 6, wherein
the reproducing comprises mixing a plurality of signals corresponding to the plurality of recorded signals with the performance signal and reproducing the mixed signal.

8. The sound processing method according to claim 6, wherein
the sound processing method further comprises analyzing similarity in content of sound between each of the plurality of recorded signals and the performance signal; and
the reducing comprises reducing a sound volume of a recorded signal determined as similar to the performance signal in the content of sound, of the plurality of recorded signals.

9. The sound processing method according to claim 6, wherein
the sound volume of the recorded signal is reduced during a performance by a user, and the reduction of the sound volume of the recorded signal is canceled after the performance ends.

10. A sound processing method executed by at least one controller, the sound processing method comprising:
reproducing a plurality of recorded signals representing recorded sounds generated by different sound generation sources;
specifying a type of a sound generation source of a performance sound represented by a performance signal; and
reducing a sound volume of a recorded signal corresponding to the specified type of the sound generation source, of the plurality of recorded signals, and
the sound processing method further comprises:
analyzing which of melody and accompaniment sounds the performance sound represented by the performance signal is equivalent to; and
deciding whether to reduce the sound volume of the recorded signal or not, based on a result of the analysis.

11. A sound processing device comprising:
a reproduction control unit that reproduces a plurality of recorded signals representing recorded sounds generated by different sound generation sources; and
a sound source identification unit that specifies a type of a sound generation source of a performance sound represented by a performance signal, wherein
the reproduction control unit refers to relation information designating a correspondence between a sound generation source of a recorded sound and a sound generation source of a performance sound, and
the reproduction control unit reduces a sound volume of a recorded signal of a sound generation source associated with the specified sound generation source in the relation information, of the plurality of recorded signals.

* * * * *